United States Patent
Yamauchi et al.

(10) Patent No.: US 6,913,945 B2
(45) Date of Patent: Jul. 5, 2005

(54) METHOD OF MOUNTING A CHIP

(75) Inventors: Akira Yamauchi, Shiga (JP); Toshihiro Mori, Shiga (JP); Yosuke Sagami, Kanagawa (JP)

(73) Assignee: Toray Engineering Co., Ltd., Osaka (JP)

( * ) Notice: Subject to any disclaimer, the term of this patent is extended or adjusted under 35 U.S.C. 154(b) by 0 days.

(21) Appl. No.: 10/450,837
(22) PCT Filed: Feb. 2, 2001
(86) PCT No.: PCT/JP01/00764
§ 371 (c)(1), (2), (4) Date: Jun. 25, 2003
(87) PCT Pub. No.: WO02/054476
PCT Pub. Date: Jul. 11, 2002

(65) Prior Publication Data
US 2004/0047127 A1 Mar. 11, 2004

(30) Foreign Application Priority Data
Dec. 28, 2000 (JP) ........................ 2000-399759

(51) Int. Cl.⁷ .......................... H01L 21/44; H01L 21/50
(52) U.S. Cl. ...................... 438/106; 438/613
(58) Field of Search ................ 438/106, 127, 438/613

(56) References Cited
U.S. PATENT DOCUMENTS
6,406,991 B2 * 6/2002 Sugihara .................. 438/613

2001/0042923 A1 * 11/2001 Yanagida .................. 257/779

FOREIGN PATENT DOCUMENTS

| JP | 2-96343 A | 4/1990 |
|----|-----------|--------|
| JP | 5-74778 A | 3/1993 |
| JP | 7-122591 A | 5/1995 |
| JP | 9-223696 A | 8/1997 |
| JP | 10-84013 A | 3/1998 |
| JP | 11-330162 A | 11/1999 |
| JP | 2000-58597 A | 2/2000 |

* cited by examiner

Primary Examiner—Amir Zarabian
Assistant Examiner—Pamela E Perkins
(74) Attorney, Agent, or Firm—Smith Patent Office

(57) ABSTRACT

A method of mounting a chip in which an underfill agent having specific viscosity behavior and a trigger temperature is applied to at least one of a substrate and the chip, bumps are press-contacted to electrodes, the underfill agent is spread around the press-contacted bumps and the electrodes between the chip and the substrate, the bumps are melted by heating while the bumps are embedded in the underfill agent to bond the molten bumps and the electrodes, and in melt-bonding the bumps, a time to wet-spread the molten bumps is kept before the underfill agent is cured. Highly reliable excellent bonding between the bumps and the electrodes can be achieved by thoroughly wet-spreading the molten bumps while secondary oxidation in the underfill agent does not occur, and the time required until the underfill agent is cured to a specified state, and further resultantly, the time required until the press of the chip is stopped can be shortened. By this method, drastic simplification of the mounting process in total and drastic shortening of the tact time are possible.

11 Claims, 3 Drawing Sheets start of pressing    stop of pressing trigger temperature press-contact | bonding of molten bumps | curing

METHOD OF MOUNTING A CHIP

BACKGROUND OF THE INVENTION

1. Field of the Invention

The present invention relates to a method of mounting a chip, and specifically to a method of mounting a chip to a substrate at a fluxless condition while applying an underfill agent between the chip and the substrate,

2. Discussion of the Related Art

A method of mounting a chip is well known, wherein bumps are formed on the chip by a solder and the like, the chip is approached to a substrate in a form of face down, and after the bumps are brought into contact with electrodes of the substrate, the bumps of the chip are heated and melted to be bonded to the electrodes of the substrate. An underfill agent, which is composed of a nonconductive adhesive, is injected into a gap between the chip and the substrate in order to increase the total bonding strength between the chip and the substrate. As this underfill agent, usually an adhesive comprising a thermosetting resin is used. The reliability of the electrical insulation between the bonded portions is increased by a condition where the underfill agent is filled around the bumps of the chip and the electrodes of the substrate bonded to each other.

In a conventional method of mounting a chip formed with solder bumps, firstly a flux is applied to the bump side or the substrate side, and after the chip is mounted on the substrate at a predetermined position, the solder bumps are melted by heating (in most cases, associated with pressing) and the bumps are preliminarily bonded to the electrodes of the substrate. After being cooled, the flux is removed by cleaning, and thereafter, an underfill agent is injected into a minute gap between the chip and the substrate from the side direction. After the underfill agent is injected, heating is performed again, the underfill agent is re-flown and thereafter cured.

In such a conventional mounting method, however, when the solder bumps are heat-melted in the preliminary bonding process of the chip and the substrate, there is a fear that the bonded portions are secondarily oxidized by the surrounding atmosphere. If such a secondary oxidation occurs, it may decrease the reliability of the electrical bonding between the bumps and the electrodes of the substrate. In order to prevent the secondary oxidation, there is a method for purging the atmosphere around the bumps using nitrogen gas and the like when the bumps are bonded to the electrodes. However, such purging by nitrogen gas and the like causes a chip mounting apparatus to become large-sized, the mounting apparatus and the mounting process to become complicated, and the cost thereof to increase, and because it is necessary to take a time for the purging by nitrogen gas and the like, a high-speed mounting may be obstructed.

Further, in the above-described conventional mounting method, because it is necessary to apply a flux and remove the flux by cleaning after the bonding for melt-bonding of the solder bumps, there is a problem that the number of processes until completion of main bonding is fairly great. Moreover, the perfect cleaning of the flux is difficult, and therefore, the residual components may reduce the reliability of the bonding. In order to achieve a fluxless bonding, proposed is a method for using an alcoholic organic material having a melting point higher than that of a solder instead of a conventional flux, and removing it by vaporizing without cleaning it after the preliminary bonding (JP-A-8-293665). In this method, however, basically only the cleaning process of the flux becomes unnecessary, and the method is poor in effect for reducing the number of the processes in the bonding. In particular, the processes for injecting an underfill agent after the preliminary bonding, for re-flowing the underfill agent and for curing the underfill agent still remain as they are. Further, in this method, as the bump pitch has been in a fine pitch condition, it has become difficult to inject the underfill agent.

With respect to such a problem, although there is no description as to fluxless condition, a method, wherein an adhesive resin (an underfill agent) is spread and filled between a substrate and a chip in which specially shaped bumps each having a small-diameter tip are formed and the bumps are bonded to the electrodes of the substrate by press-breaking the tips of the bumps of the chip, is disclosed in JP-A 11-26506.

However, the method disclosed in JP-A 11-26506 basically does not aim a method for bonding bumps to electrodes of a substrate by melting the bumps by heating. For example, if this method is applied to mounting of a chip accompanying with melting the bumps by heating, in a case where a conventional resin is used as the underfill agent, when a low-viscosity resin is used and the underfill agent is to be spread by pressing between a chip and a substrate, the underfill agent flows out, the underfill agent cannot be held so that the bumps and the electrodes press-contacted to each other are covered with the agent, and voids may be involved. On the other hand, when a high-viscosity resin is used, the bumps melted by heating cannot be thoroughly wet-spread. Therefore, the underfill agent may be nipped between the bumps and the electrodes, a compound between metals required for bonding may not be formed between the bumps and the electrodes, a resistance of the bonded portion may increase, or a sufficient bonding strength may not be obtained, and therefore, the reliability of the bonding decreases.

Further, because the underfill agent heated together with the bumps starts to be cured in a short period of time, the bumps do not thoroughly wet-spread by being suppressed in flowability by the resin starting to be cured, an enough bonding state also cannot be obtained. Further, in a conventional resin prepared as the underfill agent, if the resin viscosity is tried to be decreased as lower as possible such that the molten bumps can thoroughly wet-spread, the curing time becomes long, and it becomes difficult to shorten the tact time of the production process. Furthermore, because the conventional resin requires a long time from the start of curing to a curing degree enough for holding the bonding state of bumps and electrodes, the chip must be continued to be pressed until the curing progresses sufficiently, and it is also a great obstruction factor for shortening the tact time of the production process.

SUMMARY OF THE INVENTION

Accordingly, an object of the present invention is to provide a method which melts bumps by heating at a state where bumps and electrodes press-contacted to each other are embedded in an underfill agent and which can achieve a state up to the main bonding of the bumps and the electrodes at a condition where secondary oxidation does not occur, and in particular, to enable the bumps melted in the underfill agent to thoroughly wet-spread by using a specified adhesive which exhibits viscosity behavior and curing behavior optimum as the underfill agent, to enable the underfill agent to be quickly cured after the bumps are thoroughly wet-spread and a good bonding state is ensured, to enable the application of the underfill agent, the bonding due to heating and melting of the bumps and the curing of the underfill agent to be performed at optimum states, optimum timings and optimum times, respectively, and to enable the respective processes from the starting to elevate the temperature to a specified curing of the underfill agent to be performed efficiently in a short period of time.

Another object of the present invention is to efficiently prevent primary oxidation before the above-described mounting, and in particular, to enable the above-described mounting to be performed at a fluxless condition, thereby simplifying the process and shortening the tact time by greatly decreasing the number of processes of the whole of the mounting process.

A further object of the present invention is to optimize the timing of the curing start of the underfill agent as well as to accelerate the curing speed after the curing start, and to enable the pressing of a chip to be stopped during the curing, thereby further shortening the tact time for the chip mounting.

To accomplish the above-described objects, the present invention provides a method of mounting a chip by bonding bumps formed on at least one of the chip and a substrate to electrodes formed on the other while interposing a thermosetting underfill agent between the chip and the substrate. The method comprises the steps of preparing an adhesive as the underfill agent, the adhesive having a first viscosity at a room temperature capable of holding its self shape exhibited when the adhesive is applied, the viscosity of the adhesive being decreased from the first viscosity to a second viscosity accompanying with heating and being maintained substantially at the second viscosity within a predetermined specified temperature range, the viscosity of the adhesive being increased from the second viscosity after a specified time is expired in the specified temperature range and the adhesive being cured accompanying with the increase of the viscosity; applying the underfill agent onto at least one of the substrate and the chip; press-contacting the bumps to the electrodes by approaching and pressing the chip to the substrate while spreading the underfill agent around the bumps and electrodes press-contacted to each other between the chip and the substrate; melting the bumps by heating at a state where the bumps are embedded in the underfill agent to bond the molten bumps to the electrodes; and keeping a time for wet-spreading the molten bumps, before the underfill agent is cured, in melt-bonding of the bumps.

Namely, the underfill agent used in the present invention has a relatively high viscosity at a stage being applied (the first viscosity), and therefore, the underfill agent can hold its self shape exhibited when applied, and the underfill agent is maintained at the state where the underfill agent does not flow out. By approaching the chip to the substrate from the applicationstate, the applied underfill agent is gradually press-spread. Because the underfill agent has the relatively high first viscosity at that time, the press-spread underfill agent is filled around the bumps and the electrodes press-contacted to each other without involving voids.

At the state where the press-contacted bumps and electrodes are embedded in the underfill agent, the bumps and the underfill agent are heated and the molten bumps are bonded to the electrodes. Since it is a bonding in the underfill agent without contact with oxygen, the molten bumps are interrupted from the surrounding atmosphere and the second oxidation can be effectively prevented. Because the viscosity of the underfill agent has decreased down to the second viscosity, which is relatively low, by heating, the molten bumps can thoroughly wet-spread without being obstructed by the underfill agent. Besides, since the underfill agent is kept substantially at this second viscosity during the time when the underfill agent is in a temperature within the above-described specified temperature range (including both cases of a case where the heating is continued slowly and a case where the temperature is held substantially at a melting temperature of the bumps), a time required for wet-spreading the molten bumps thoroughly can be kept, and a good bonding of the bumps and the electrodes can be achieved. After the molten bumps are thoroughly wet-spread, the specified curing of the underfill agent is started.

In particular, in the present invention, this curing of the underfill agent can be started by a trigger. Namely, as the above-described underfill agent, an underfill agent, which has a trigger temperature that is an induction point for starting of curing and of which curing progresses regardless of the temperature of the underfill agent after the temperature of the underfill agent has once reached the trigger temperature, can be used. By using an underfill agent having such a trigger temperature, a sufficient time for wet-spreading the molten bumps can be easily kept.

For example, in a case where an underfill agent, whose trigger temperature is set at a temperature of not higher than a melting point of the bumps, is used, the time for wet-spreading the bumps, which reaches the melting point after reaching the trigger temperature and is then melted, can be enough kept by adequately setting a curing time of the underfill agent required after reaching the trigger temperature. In a case where an underfill agent, whose trigger temperature is set at a temperature higher than a melting point of the bumps, is used, by heating the underfill agent to the trigger temperature when a specified time expires after the bumps are melted, a time required for wet-spreading the bumps can be arbitrarily set, and the curing of the underfill agent can be started at an optimum timing. The latter case is more preferable because the freedom is higher and the time for wet-spreading can be set more accurately. In any case, after reaching the trigger temperature, the underfill agent can be quickly cured at a desirable speed, and in the latter case, the underfill agent can be rapidly cured more easily. By the rapid curing of the underfill agent, it becomes possible to stop the pressing of the chip at a stage with a certain progress of the curing of the underfill agent before the underfill agent is completely cured. Namely, even if the pressing of the chip is stopped on the way, the curing of the underfill agent is continued as it is while the bonding state of the chip and the substrate is held, and then the underfill agent is cured naturally. Since the process can be transferred to the next chip mounting by stopping the pressing of the chip, in a case where a large number of chips are mounted continuously, the tact time can be greatly shortened.

In the above-described bonding, since the processes up to a reflow of the molten bumps, which has been performed in the conventional main bonding process, are performed at a time in the underfill agent while secondary oxidation is prevented, basically, even if the mounting process is not divided into a preliminary bonding process and a main bonding process as in the conventional method, the process substantially up to completion of main bonding can be performed in the underfill agent, the chip mounting process can be simplified and the tact time of the whole of the process can be shortened.

Further, in the present invention, in addition to the above-described prevention of secondary oxidation by the bonding in the underfill agent, it is preferred that, before the chip is mounted to the substrate, at least one of the bumps and electrodes are treated for preventing primary oxidation thereof, that may occur by the time of the mounting by the atmosphere during storage and the like, or that may occur associated with a certain pre-treatment such as heating treatment for forming solder bumps and the like. As the primary oxidation preventing treatment, a chemical treatment such as a treatment using a flux and the like can be employed, and a treatment, wherein the bumps or the electrodes are cleaned by energy wave or energy particles, can also be employed. As the energy wave or energy particles, for example, any of a plasma, an ion beam, an atomic beam, a radical beam and a laser can be used. Further, as the primary oxidation preventing treatment, for example, treatments can also be employed, wherein a substituent for removing oxygen such as a fluoro group is chemically bonded to the surfaces of the bumps or electrodes, thereby forming an anti-oxidation surface layer, wherein an oxide is removed from the surfaces by reducing operation due to hydrogen, and wherein gold is plated to the surfaces.

Especially, by applying such a primary oxidation preventing treatment, a fluxless mounting becomes possible, and because processes for applying a flux and for cleaning become unnecessary, the number of the processes of the whole of the mounting process can be further decreased. Therefore, in the method according to the present invention including this primary oxidation preventing treatment, the mounting can be completed substantially by only two processes of the process of the primary oxidation preventing treatment and the process of the heat bonding of the chip and the substrate including the application of the underfill agent, the number of the processes of the whole of the chip mounting can be greatly decreased, both the process and the apparatus can be simplified, and the tact time can be further shortened.

In the present invention, the bumps are formed on at least one of the chip and the substrate. Namely, there are (A) a case where the bumps are formed on the chip and the electrodes are formed on the substrate, (B) a case where the bumps are formed on the substrate and the electrodes are formed on the chip, and (C) a case where the bumps are formed on each of the chip and the substrate. Therefore, particularly in the case of(C), the "electrode" according to the present invention means a technical concept including a bump.

Thus, in the chip mounting method according to the present invention, an underfill agent with a specified viscosity behavior and a trigger temperature is used, a highly reliable excellent bonding between the bumps and the electrodes can be achieved by thoroughly wet-spreading the molten bumps while secondary oxidation in the underfill agent does not occur, and the time required until the underfill agent is cured to a specified state, and further resultantly, the time required until the press of the chip is stopped can be shortened. Moreover, by also including a primary oxidation preventing treatment, a fluxless mounting becomes possible. Therefore, by this method according to the present invention, drastic simplification of the mounting process in total and drastic shortening of the tact time become possible.

DETAILED DESCRIPTION OF THE PREFERRED EMBODIMENTS

Hereinafter, desirable embodiments of the present invention will be explained referring to figures.

Figure 1:
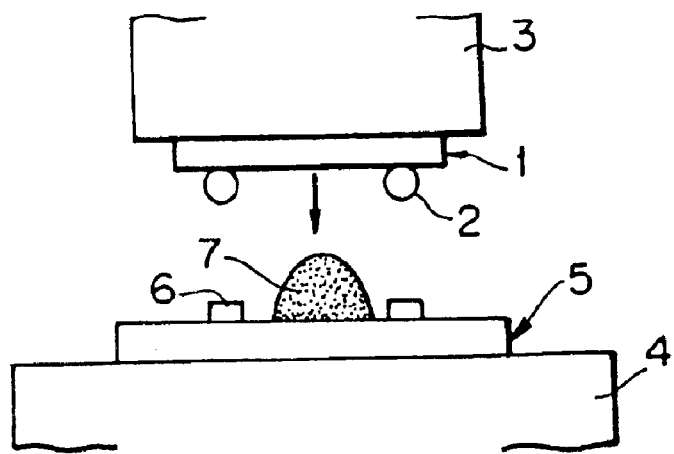
FIG. 1 is a schematic side view showing a state before chip mounting in a method of mounting a chip according to an embodiment of the present invention.

FIG. 1 shows a state immediately before chip mounting in a method of mounting a chip according to an embodiment of the present invention, and shows a case where bumps are formed on the chip side and electrodes are formed on the substrate side. In FIG. 1, numeral 1 shows a chip (for example, an IC chip), and at positions corresponding to the positions of electrodes (not shown) on the lower surface of the chip, bumps 2 (in this embodiment, solder bumps) are formed. Where, the "solder" is not limited to a solder composed of lead and tin, and means all substances capable of being bonded after the metal is melted. The above-described chip 1 is held by suction on the lower surface of a heat tool 3 of a chip bonding machine. In this embodiment, a primary oxidation preventing treatment such as the aforementioned treatment is performed to the surfaces of at least one of bumps 2 and electrodes of a substrate, and the solder bonding can be carried out without applying a flux.

As the primary oxidation preventing treatment for bumps 2 or the electrodes, except a chemical treatment using a flux or the like similarly to in the conventional method, the aforementioned treatments can be employed such as a treatment for cleaning by energy wave or energy particles, a chemical treatment for chemically bonding a substituent such as fluoro groups or the like, a treatment for removing an oxide from the surfaces by reducing operation due to hydrogen, and a treatment for plating gold onto the surface of the bumps or the electrodes. Further, a method for carrying out the mounting under a time control (within a predetermined time) before being oxidized again after the cleaning using the energy wave or energy particles or using a solution, or a method for carrying out the mounting in an atmosphere of Ar or $N_2$ after the above-described cleaning, can also be applied.

Below chip 1, a substrate 5 (for example, a circuit board or a liquid crystal board) is held on and fixed to a stage 4 for the substrate of the chip bonding machine. Electrodes 6 are formed on substrate 5 by, for example, gold plating. In this bonding machine, the position of substrate 5 held and fixed on the stage 4 is controlled relative to chip 1 held by suction on the lower surface of heat tool 3, and particularly, corresponding bumps 2 and electrodes 6 of substrate 5 are aligned to each other.

Before mounting chip 1 onto substrate 5, a thermosetting underfill agent 7 is applied to at least one of chip 1 and substrate 5, in this embodiment, onto the upper surface of substrate 5. Although a thermosetting underfill agent composed of a nonconductive adhesive is used as the thermosetting underfill agent 7 in this embodiment, as the thermosetting underfill agent in the present invention, a nonconductive paste, a nonconductive film, and an anisotropic conductive paste and film containing conductive particles such as gold plated plastic particles or solder particles are included. Although it is preferred that underfill agent 7 is applied after substrate 5 is held on stage 4 from the viewpoint of an accurate application at a desirable, it is also possible to apply it before being held. Further, in the state shown in FIG. 1, underfill agent 7 is applied so as to protrude in a form of a convex. Such a convex style application can be carried out by using a dispenser. As another method, it is possible to apply underfill agent 7 by screen printing, for example, in a plate-like form partially applied. However, in order to prevent voids from being involved more surely when underfill agent 7 is spread as described later, it is preferred to apply the underfill agent 7 in a convex form as described above.

This underfill agent 7 comprising a thermosetting nonconductive adhesive has a relatively high first viscosity which can keep its self shape of a convex form at the state being applied as shown in FIG. 1, and exhibits a characteristic in which the viscosity decreases from the first viscosity to a relatively low second viscosity accompanying with heating and is maintained substantially at the second viscosity within a predetermined specified temperature range and for a specified time, and after the specified time is expired, with a time delay from the time reaching the second viscosity, by setting a trigger temperature for starting curing, the viscosity increases from the second viscosity and the curing progresses. Underfill agent 7 having such a characteristic is applied to at least one of the chip and the substrate, for example, at a room temperature. In this embodiment, the underfill agent 7 is applied onto substrate 5 as shown in FIG. 1.

Figure 2:
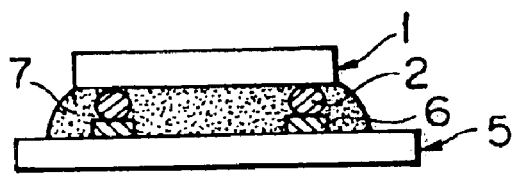
FIG. 2 is a schematic vertical sectional view showing a state where bumps and electrodes are press-contacted to each other in the chip mounting method shown in FIG. 1.
Figure 3:
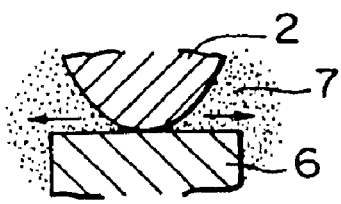
FIG. 3 is an enlarged sectional view of a bump-electrode portion at a time immediately before reaching the state shown in FIG. 2.

The above-described first viscosity and second viscosity are appropriately set in accordance with the self-shape keeping property of underfill agent 7 and the melting temperature of bumps 2, and the above-described specified temperature range and the specified time maintained substantially at the second viscosity are appropriately set in consideration of a time for thoroughly wet-spreading bumps 2 melted at the heating process. Namely, the first viscosity is set to a viscosity at which the self shape of the underfill agent in a convex form as shown in FIG. 1 can be held at the state being applied or at which a specified self shape of the underfill agent applied by, for example, a screen printing can be held, and which can deliver an atmosphere gas toward an outer side from a gap between the chip 1 and the substrate 5 without involving voids by maintaining the relatively high viscosity when the underfill agent is spread by pressing between the chip 1 and the substrate 5 as shown in FIGS. 2 and 3. The second viscosity is set mainly from the relationship with the flowability of bumps 2 when the bumps 2 is started to be melted, and set to a viscosity which is sufficiently low so that the underfill agent does not resist an enough wet spreading of bumps 2 when the bumps 2 are melted. Further, the above-described specified temperature range or specified time for keeping the viscosity substantially at the second viscosity is set in a range in which the curing of underfill agent 7 is not started at least during the time capable of wet-spreading the molten bumps 2 thoroughly or in which the curing does not progress and a time enough for wet-spreading the bumps 2 can be kept.

This time enough for wet-spreading the bumps 2 can be kept as follows, in accordance with the trigger temperature. Namely, In a case where the trigger temperature is set at a temperature of not higher than the melting point of bumps 2, it can be set as a time from the trigger to the curing of the underfill agent. In a case where the trigger temperature is set at a temperature higher than the melting point of bumps 2, the time for the wet-spreading can be arbitrarily set by, after reaching the melting point of bumps 2, maintaining the temperature at the melting point or at a temperature lower than the trigger temperature, and the underfill agent can be rapidly cured by raising the temperature higher than the trigger temperature after wet-spreading of the bumps 2. The latter method is more preferable from the viewpoint of the freedom for setting the time for the wet-spreading and from the viewpoint of the rapid curing.

Figure 5:
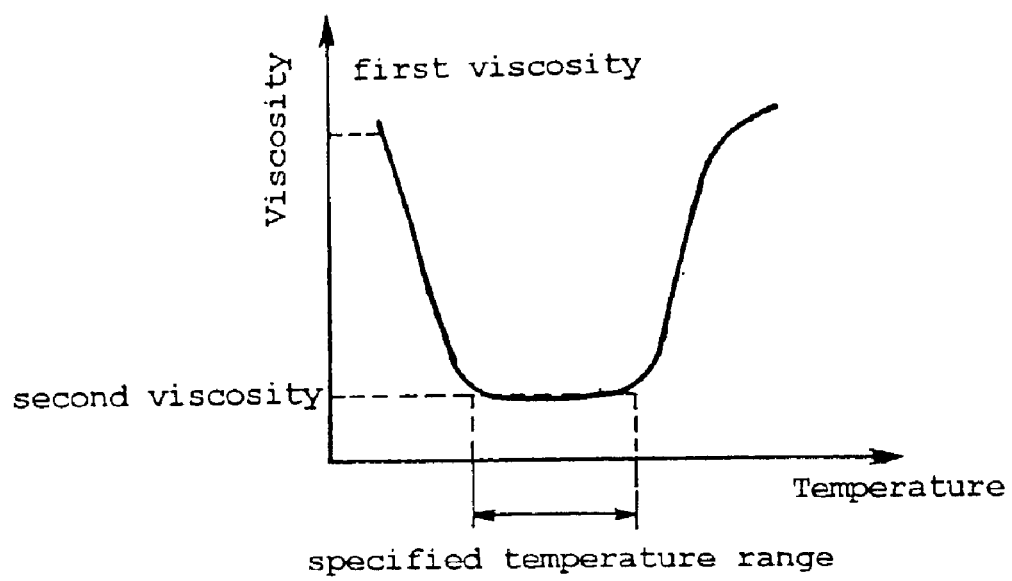
FIG. 5 is a graph showing an example of a temperature-viscosity characteristic of an underfill agent used in a mounting method according to an embodiment of the present invention.
Figure 7A:
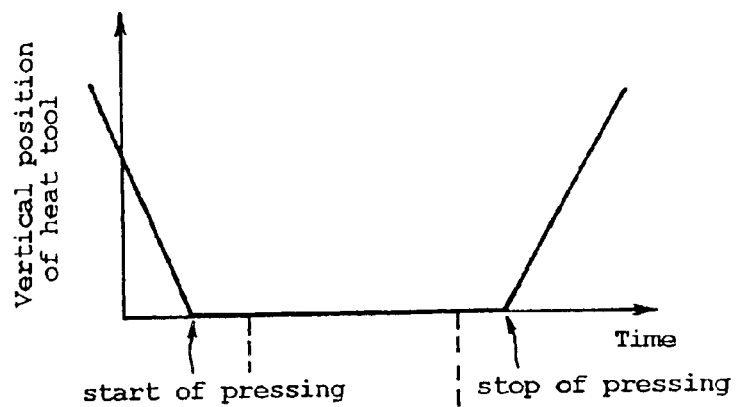
FIG. 7A is a graph showing the vertical position of the head of the heating tool and showing the operation in which the heating tool is moved down and the chip is pressed to substrate, and after being pressed for a certain time, the pressing is stopped.
Figure 7B:
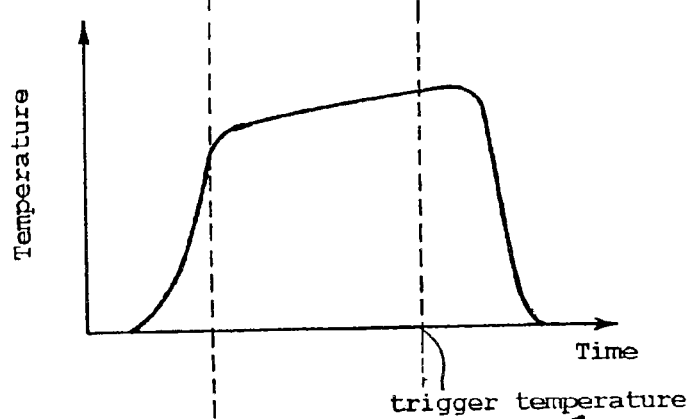
FIG. 7B is a graph showing the temperature behavior of the underfill agent and bumps, and in the behavior, after gradually being heated, the temperature reaches the melting temperature of the bumps.
Figure 7C:
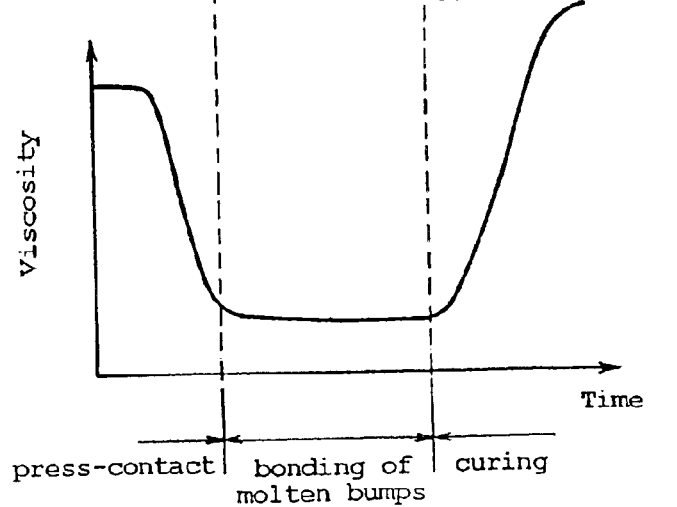
FIG. 7C is a graph showing the step progress in an embodiment of the present invention, and the chip is pressed to the substrate, the bumps are press-contacted to the electrodes and the underfill agent is spread.

Such a characteristic of underfill agent 7 is represented as shown in FIG. 5 from the relationship with temperature and represented as shown in FIG. 7(C) described later from the relationship with time. In the characteristic shown in FIG. 5, the viscosity indicates a relatively high first viscosity at a room temperature, decreases gradually accompanying with rise of the temperature, and when the bumps 2 are heated at a temperature starting the bumps to be melted, the viscosity indicates a relatively low second viscosity. During the viscosity is present within the specified temperature range, the viscosity is kept substantially at the low second viscosity, and when the temperature is raised higher than the specified temperature range, the viscosity increases and the underfill agent is cured relatively quickly. This specified temperature range may be appropriately set depending on the temperature elevation characteristic in the chip mounting. Such a characteristic of underfill agent 7 can be achieved by adjusting the combination and the composition of the resin forming the underfill agent 7 and the curing agent thereof. For example, in order to adjust the characteristic shown in FIG. 5 to a desirable characteristic with a relatively great freedom, it is preferred to use a liquid-like bismaleimide resin and a curing agent of a peroxide. This underfill agent comprising a liquid-like bismaleimide resin and a peroxide curing agent exhibits a relatively high viscosity at a room temperature as described above, and when the temperature is raised, the resin and the curing agent are started to be reacted before reaching the melting start temperature of the bumps, and first the viscosity decreases accompanying with the rise of the temperature When the temperature almost reaches the melting start temperature of the bumps, the viscosity decreases down to the second viscosity as describe above, and even if the temperature is raised thereafter, the viscosity is kept substantially at the second viscosity within the specified temperature range, and during the period, a time enough for wet-spreading the molten bumps can be ensured. When the temperature is further raised and reaches the set trigger temperature, the viscosity increases relatively rapidly and the underfill agent is cured relatively quickly. This trigger temperature can be set relatively arbitrarily by compounding the curing agent, and the higher the trigger temperature is, the quickly the underfill agent is cured.

Figure 6:
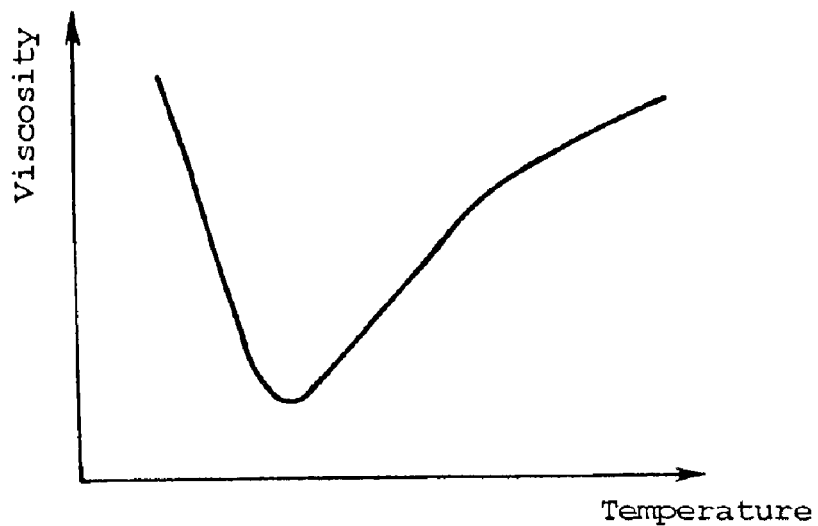
FIG. 6 is a graph showing an example of a temperature-viscosity characteristic of a conventional underfill agent.

The resin used as the conventional underfill agent has a viscosity-temperature characteristic as shown in FIG. 6. Namely, although the viscosity of the underfill agent decreases by temperature elevation from a room temperature, substantially there is no temperature range which can keep the decreased viscosity, and the viscosity starts to increase immediately by the temperature elevation and the curing starts. Therefore, a time enough for wet-spreading the molten bumps cannot be kept. Further, because the progress of the curing is slow, a long time is required from the start of the curing to a state nearly being completely cured, and during the period, it is necessary to keep the state in which the chip is pressed, so that the bonding state of the bumps and the electrodes does not deteriorate. Since the time reaching the state capable of stopping the pressing of the chip is long, it is difficult to shorten the tact time. In the present invention, such problems can be all solved.

The operation and advantages in a case where the underfill agent 7 according to the present invention is used will be explained referring to FIGS. 2–4 which show an example of step progress in the bonding process. As shown in FIG. 2, chip 1 and substrate 5 are approached to each other, from the state shown in FIG. 1, In this embodiment, heat tool 3 is moved downward, and bumps 2 of chip 1 are brought into contact with and pressed to corresponding electrodes 6 of substrate 5. At that time, as shown in FIG. 2, underfill agent 7 having been applied on substrate 5 is pressed and spread between chip 1 and substrate 5, and it fills a gap therebetween. Further, at that time, even if underfill agent 7 being spread is likely to be interposed between bumps 2 and electrodes 6, or, underfill agent 7 is likely to be present on electrodes 6 from the stage that the underfill agent 7 is applied prior to the mounting, the underfill agent 7 having been present between bumps 2 and electrodes 6 is pushed away toward around them in the process in which bumps 2 are press-contacted to electrodes 6, as shown in FIG. 3. Particularly, by moving down heat tool 3 at an appropriate pressing force and press-contacting bumps 2 to electrodes 6 at an appropriate pressure, bumps 2 can be press-contacted directly to electrodes 6 without interposing underfill agent 7 therebetween. Especially, by forming the tip portion (tip portion of the lower surface) of each bump 2 as a shape close to a spherical surface, underfill agent 7 present around the tip portion is pushed away to around the bump 2 and the electrode 6 in contact with each other efficiently and smoothly.

This spreading of underfill agent 7 is carried out at an application temperature (for example, at a room temperature), or during a period in which the temperature has not yet been elevated so much from the application temperature. In this stage, because the viscosity of underfill agent 7 is a relatively high first viscosity or a viscosity close to the first viscosity as aforementioned, the underfill agent does not flow excessively between chip 1 and substrate 5, and the underfill agent 7, which has been applied as shown in FIG. 1, is pushing away the atmosphere gas, which has been present around it, toward all directions gradually and smoothly, and is spread without involving voids. Further, as shown in FIG. 3, the atmosphere gas is pushed away from portions around bumps 2 and electrodes 6 press-contacted to each other, similarly without involving voids, and the bumps 2 and electrodes 6 are embedded in the spread underfill agent 7 at a state where the bumps 2 and electrodes 6 are completely interrupted from the atmosphere.

In this state, chip 1, ultimately, bumps 2 and underfill agent 7, are started to be heated, the viscosity of the underfill agent 7 decreases gradually from the first viscosity, and accompanying with the temperature elevation, the viscosity soon reaches the second viscosity. Further, when heated to a predetermined temperature, in this embodiment, substantially when heated to a temperature at which the viscosity of the underfill agent 7 reaches the second viscosity, the melting of bumps 2 starts, and the molten bumps 2 are bonded to electrodes 6. Because bumps 2 and electrodes 6 are completely interrupted from the surrounding atmosphere by the underfill agent 7, a secondary oxidation does not occur in the heat-melted bumps 2. Therefore, purging of the atmosphere by nitrogen gas and the like for preventing the secondary oxidation as in a conventional method is unnecessary, thereby greatly simplifying both the apparatus and the process.

Further, in this embodiment, since a primary oxidation preventing treatment is carried out for bumps 2 in advance, application of flux such as in a conventional method is unnecessary, and cleaning of flux after heat-melting and bonding, which is required in a case of flux application, is also unnecessary. Therefore, the process can be further simplified.

Furthermore, by heating bumps 2 at a predetermined temperature and melting the bumps 2 in underfill agent 7, the bumps 2 can sufficiently wet-spread in the low-viscosity underfill agent 7 and can be bonded to electrodes 6 at a good state. Therefore, in this method, it becomes possible to perform a main bonding at a time without separating the main bonding from a preliminary bonding, and the number of processes required by the time reaching the completion of the main bonding can be greatly decreased. From this point of view, both the apparatus and the process can be greatly simplified.

After reaching the melting temperature of the bumps 2 as described above, the viscosity of the underfill agent 7 is kept substantially at the second viscosity at least for a time necessary for thoroughly wet-spreading the bumps 2. Because this second viscosity is set at a sufficiently low viscosity, the underfill agent 7 does not exhibit a great resistance when the molten bumps 2 are wet-spread, the molten bumps 2 wet-spreads thoroughly in a good state as shown in FIG. 4, and an electrically excellent bonding state with electrodes can be achieved. Further, by keeping the viscosity of the underfill agent 7 at the second viscosity within the specified temperature range, a time required for a good wet-spreading of the molten bumps 2 can be ensured during the time within the temperature range, and therefore, a time necessary for thoroughly wet-spreading the bumps 2 is automatically kept. Furthermore, even in a condition where the viscosity of the underfill agent 7 is in a state being held between the chip 1 including the side 8 of the chip 7 and the substrate 5, the underfill agent 7 does not flow out from the gap between the chip 1 and the substrate 5 by the surface tension or the adhesive force and the aforementioned spread state between the chip 1 and the substrate 5 can be maintained substantially as it is.

Figure 4:
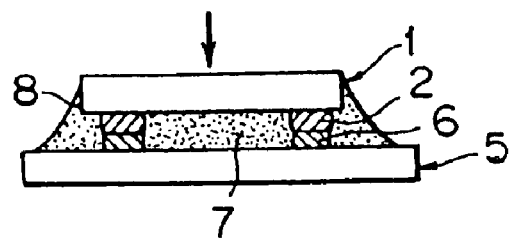
FIG. 4 is a schematic vertical sectional view showing a state where the bumps are melted and bonded to the electrodes from the state shown in FIG. 2.

As shown in FIG. 4, after a specified time expires after the desirable bonding of bumps 2 and electrodes 6 starts, namely, after a time delay necessary for thoroughly wet-spreading the bumps 2 is given after start of the melting of the bumps 2, the temperature of underfill agent 7 reaches the trigger temperature by heating, the viscosity of the underfill agent 7 is increased, and the underfill agent 7 is quickly cured. The curing speed is higher than that of an underfill agent using a conventional resin, and the time for reaching a specified curing state can be greatly shortened. Namely, if the pressing of chip 1 is stopped in a time when the underfill agent 7 is not cured sufficiently, by the elastic restoration force of the underfill agent 7, chip 1 may be raised or a bad influence may be given to the bonding state of bumps 2 and electrodes 6, but if the pressing of chip 1 is stopped after the underfill agent 7 has been sufficiently cured, such a fear can be removed. Since underfill agent 7 according to the present invention is cured rapidly, it is possible to stop the pressing of chip 1 in a short period of time after start of curing, and therefore, because the process can be transferred to the next mounting after the stopping, the tact time can be shortened.

Particularly, in a case where underfill agent 7 has a trigger temperature which becomes a induction point for start of curing as described above, after the temperature of the underfill agent 7 has once reached the trigger temperature, it is possible to progress the curing regardless of the temperature of the underfill agent 7. Therefore, it is possible to stop the pressing of chip 1 at a stage being cured at a degree at which an inconvenience does not occur, and after that, it is possible to take out the chip 1 and the substrate 5 from the apparatus and to complete the curing naturally under a non-pressing and non-heating condition. By setting such a trigger temperature, in a series of processes accompanying the melting of bumps 2, in the above-described embodiment, after the molten bumps 2 are thoroughly wet-spread, as the case may be, immediately before the wet-spreading is completed, the curing of the underfill agent 7 is started by reaching the trigger temperature, and thereafter, the curing progresses naturally. The pressing of chip 1 may be stopped after an appropriately short time is expired after reaching the trigger temperature.

A series of processes of chip mounting in the above-described embodiment will be shown, for example, as depicted in FIGS. 7(A), (B) and (C). In each figure, the axis of abscissas indicates a time axis, FIG. 7(A) shows the vertical position of the head of heat tool 3, and shows the operation in which the heat tool 3 is moved down and chip 1 is pressed to substrate 5, and after being pressed for a certain time, the pressing is stopped. FIG. 7(B) shows the temperature behavior of underfill agent 7 and bumps 2, and in the behavior, after gradually heated, the temperature reaches the melting temperature of bumps 2, and in this example, thereafter slowly heated, the bumps 2 are thoroughly wet-spread within the specified temperature range and the viscosity of the underfill agent 7 is kept substantially at the aforementioned second viscosity. When the temperature reaches the trigger temperature of underfill agent 7, the curing of the underfill agent 7 is started, and the heating is stopped at an appropriate temperature, the underfill agent 7 is cured naturally. Further, after an appropriate time expires after the start of the curing of the underfill agent 7, the pressing of chip 1 is stopped. Where, after reaching the melting temperature of bumps 2, the temperature may be kept substantially constant, and at that temperature, the trigger for start of curing the underfill agent 7 may be applied with a time delay. Further, as aforementioned, it is also possible to set the trigger temperature at a temperature of not higher than the melting temperature of bumps 2, and to keep a time for wet-spreading the bumps 2 by the curing time of the underfill agent after reaching the trigger temperature. FIG. 7(C) shows the aspect of the step progress in the above-described embodiment, and firstly, chip 1 is pressed to substrate 5, bumps 2 are press-contacted to electrodes 6 and underfill agent 7 is spread. At a state where the viscosity of underfill agent 7 decreases down to the second viscosity, the bonding of molten bumps 2 to electrodes 6 is carried out, and when reaching the trigger temperature after a time enough for wet-spreading, the curing of the underfill agent 7 is started, and after reaching the trigger temperature, the underfill agent 7 is rapidly cured.

Thus, in the method of mounting a chip according to this embodiment, a fluxless mounting becomes possible by the primary oxidation preventing treatment carried out in advance, it becomes possible to achieve a main bonding at a time while preventing secondary oxidation by bonding molten bumps 2 to electrodes 6 in underfill agent 7 at a condition interrupted from the surrounding atmosphere, a high-reliability bonding can be surely carried out by starting the underfill agent 7 to be cured with a time delay after thoroughly wet-spreading the molten bumps 2, and it becomes possible to shorten the curing time and to stop the pressing of chip 1 on the way reaching a complete curing, by starting the curing of the underfill agent 7 using the trigger temperature as the curing initiating point. Therefore, with an extremely small number of processes, the aimed high-reliability bonding can be realized, the apparatus and the process can be both simplified and the tact time can be greatly shortened.

Although bumps 2 of chip 1 side are formed as solder bumps, electrodes 6 of substrate 5 side may be composed of a solder, and both may be composed of a solder. In a case where bumps are formed on both sides, as aforementioned, the "electrode" according to the present invention means a technical concept including a bump. Further, it is possible to employ polymer bumps as the bumps to be melt-bonded. Furthermore, in the present invention, the formation of chip 1 is not particularly limited, the present invention can be effectively applied to any type of chip as long as it has bumps to be melt-bonded as described above. Moreover, the formation of substrate 5 is not particularly limited, the present invention can be applied to any type of substrate to which a chip having bumps is mounted.

In particular, the present invention is suitable for bonding of objects having many bumps or for bonding of objects formed with bumps at a fine pitch. Particularly, in a case of many bumps, the present invention can be easily carried out by setting a pressure per one bump adequately. Further, even in a case of an object having bumps at a fine pitch, it is not necessary to inject an underfill agent into a gap between a chip and a substrate approached to each other, and the present invention can be easily carried out because the underfill agent may be applied initially.

INDUSTRIAL APPLICATIONS OF THE INVENTION

The present invention can be applied to any chip mounting method in which an underfill agent is applied between a chip and a substrate, a high-reliability excellent bonding of bumps and electrodes can be achieved by thoroughly wet spreading molten bumps, and the time until the underfill agent is cured to a specified state, and further, the time for stopping the pressing of the chip by the curing, can be shortened. Further, a fluxless mounting becomes possible by including a specified primary oxidation preventing treatment. Therefore, the method according to the present invention is an extremely useful method in a case where a great simplification of the whole of the mounting process and a great shortening of the tact time are required.

What is claimed is:

1. A method of mounting a chip by bonding bumps formed on at least one of the chip and a substrate to electrodes formed on the other while interposing a thermosetting underfill agent between the chip and the substrate, said method comprising the steps of:

preparing an adhesive as said underfill agent, said adhesive having a first viscosity at a room temperature capable of holding its self shape exhibited when said adhesive is applied, the viscosity of said adhesive being decreased from said first viscosity to a second viscosity accompanying with heating and being maintained substantially at said second viscosity within a predetermined specified temperature range, the viscosity of said adhesive being increased from said second viscosity after a specified time is expired in said specified temperature range and said adhesive being cured accompanying with the increase of the viscosity;

applying said underfill agent onto at least one of said substrate and said chip;

press-contacting said bumps to said electrodes by approaching and pressing said chip to said substrate while spreading said underfill agent around the bumps and electrodes press-contacted to each other between said chip and said substrate;

melting said bumps by heating at a state where said bumps are embedded in said underfill agent to bond the molten bumps to said electrodes; and wet-spreading the molten bumps before said underfill agent is cured.

2. The method of mounting a chip according to claim 1, wherein, as said underfill agent, an underfill agent, which has a trigger temperature that is an induction point for starting of curing and of which curing progresses regardless of the temperature of the underfill agent after the temperature of the underfill agent has once reached said trigger temperature, is used.

3. The method of mounting a chip according to claim 2, wherein said trigger temperature is set at a temperature of not higher than a melting point of said bumps, and said step of wet-spreading the molten bumps is performed for a period of a curing time of said underfill agent required after reaching said trigger temperature.

4. The method of mounting a chip according to claim 2, wherein said trigger temperature is set at a temperature higher than a melting point of said bumps, and said underfill agent is heated to said trigger temperature when a specified time expires after said bumps are melted, thereby starting curing of said underfill agent.

5. The method of mounting a chip according to claim 1, wherein said pressing of said chip is stopped before said underfill agent is completely cured.

6. The method of mounting a chip according to claim 1, further comprising a step of treating at least one of said bumps and electrodes for preventing a primary oxidation thereof that may occur by the time of the mounting before said chip is mounted to said substrate.

7. The method of mounting a chip according to claim 6, wherein said step of cleaning at least one of said bumps and electrodes is performed by at least one of an energy wave and energy particles as said treatment for preventing said primary oxidation.

8. The method of mounting a chip according to claim 7, wherein at least one of a plasma, an ion beam, an atomic beam, a radical beam and a laser is used as said energy wave or energy particles.

9. The method of mounting a chip according to claim 6, wherein a substituent for removing oxygen is chemically bonded to surfaces of at least one of said bumps and electrodes, or, an oxide is removed from said surfaces by reducing operation due to hydrogen, as said treatment for preventing said primary oxidation.

10. The method of mounting a chip according to claim 6, wherein said step of cleaning includes gold-plating at least one of said bumps and electrodes as said treatment for preventing said primary oxidation.

11. A method of mounting a chip by bonding bumps formed on at least one of the chip and a substrate to electrodes formed on the other while interposing a thermosetting underfill agent between the chip and the substrate, said method comprising the steps of:

preparing an adhesive as the underfill agent, the adhesive having a viscous property wherein the adhesive has a first viscosity which allows the adhesive to hold its shape at room temperature, and a second viscosity which allows the adhesive to flow within a temperature range between a first temperature higher than the room temperature and a trigger temperature which is higher than the first temperature and at which thermosetting starts;

applying the underfill agent onto at least one of the substrate and the chip;

press-contacting the bumps to the electrodes by approaching and pressing the chip to the substrate while spreading the underfill agent around the bumps and electrodes are press-contacted to each other between the chip and the substrate;

melting the bumps by heating at a state where the bumps are embedded in the underfill agent to bond the molten bumps to the electrodes; and wet-spreading the molten bumps before the underfill agent is cured.

* * * * *